(12) United States Patent
Yamaguchi et al.

(10) Patent No.: US 7,391,089 B2
(45) Date of Patent: Jun. 24, 2008

(54) SEMICONDUCTOR DEVICE AND METHOD OF MANUFACTURING THE SAME

(75) Inventors: Shinpei Yamaguchi, Kanagawa (JP); Kaori Tai, Kanagawa (JP); Tomoyuki Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/365,313

(22) Filed: Mar. 1, 2006

(65) Prior Publication Data
US 2006/0197166 A1    Sep. 7, 2006

(30) Foreign Application Priority Data
Mar. 7, 2005    (JP)    ............................ P2005-061999

(51) Int. Cl.
*H01L 29/78* (2006.01)
(52) U.S. Cl. .................. 257/412; 257/384; 257/388; 257/486; 257/E21.593; 257/E23.163; 438/585; 438/592

(58) Field of Classification Search ............... None
See application file for complete search history.

(56) References Cited

U.S. PATENT DOCUMENTS
2006/0027879 A1*  2/2006  Koyama et al. ............ 257/388

OTHER PUBLICATIONS

Chang Seo Park and Byung Jin Cho; Thermally Stable Fully Silicided Hf-Silicide Metal-Gate Electrode; IEEE Electron Device Letters; vol. 25, No. 6; 2004.
Y. Akasaka et al.; Material Selection for the Metal Gate/High-k Transistors; Ext. Abst. SSDM 2004, pp. 196-197.

* cited by examiner

*Primary Examiner*—A. Sefer
*Assistant Examiner*—Scott R Wilson
(74) *Attorney, Agent, or Firm*—Sonnenschein Nath & Rosenthal LLP

(57) ABSTRACT

A semiconductor device which includes a field effect transistor having a gate electrode on the upper side of a semiconductor substrate, with a gate insulation film therebetween, wherein at least the gate insulation film side of the gate electrode includes a film containing hafnium and silicon.

13 Claims, 6 Drawing Sheets

SEMICONDUCTOR DEVICE AND METHOD OF MANUFACTURING THE SAME

CROSS REFERENCES TO RELATED APPLICATIONS

The present invention contains subject matter related to Japanese Patent Application JP 2005-061999 filed in the Japanese Patent Office on Mar. 7, 2005, the entire contents of which being incorporated herein by reference.

BACKGROUND OF THE INVENTION

The present invention relates to a semiconductor device and a method of manufacturing the same such that the leakage current can be restrained and the gate insulation film can be made thinner.

Enhancement of the degree of integration and the operating speed of transistors has been realized by miniaturizing the transistors based on the scaling rule. Thinning of the gate insulation film has progressed, and, for example, in transistors with a gate length of 0.1 μm or less, it may be necessary to reduce the thickness of the gate insulation film to or below 2 nm. Ordinarily, polycrystalline silicon (hereinafter referred to as poly-Si) has been used as a gate electrode material. The reason lies in that when poly-Si is thus used, the interface between the gate electrode and the gate insulation film thereebeneath is stable, and it is easy to introduce an impurity into poly-Si by techniques such as implantation, diffusion, etc., so that it is possible, by selecting the element and concentration of the impurity, to provide each of N-channel MOS field effect transistors (hereinafter referred to as NMOSFET) and P-channel MOS field effect transistors (hereinafter referred to as PMOSFET) with a gate electrode having an optimum work function and to obtain an optimum threshold value.

However, attendant on the progress of miniaturization of transistors, the problem of depletion of the gate electrode has come to be conspicuous. The depletion of the gate electrode is a phenomenon which is difficult to restrain, since poly-Si is a semiconductor. To cope with this problem, it has been widely reported that the depletion of the gate electrode can be restrained by forming a metallic film, in place of poly-Si film, directly on the gate insulation film, and attention has been paid to the development of a metal gate.

However, in the case where the metal gate is formed of a single metal, the work function of the gate electrode is the same for both the NMOSFET and the PMOSFET; therefore, unlike the case of the conventional poly-Si gate, it is difficult to control the work functions of the gate electrodes of the NMOSFET and the PMOSFET, and it may be impossible to obtain an appropriate threshold value. To overcome this problem, there has been proposed a dual-metal gate, in which metallic materials are so selected that the metal gate electrode of the NMOSFET has a work function similar to that of the N-type poly-Si whereas the metal gate electrode of the PMOSFET has a work function similar to that of the P-type poly-Si (see, for example, Chang Seo Park, Byung Jin Cho, Dim-Lee Kwong "Thermally Stable Fully Silicided Hf-Silicide Metal-Gate Electrode," IEEE ELECTRON DEVICE LETTERS, Vol 25, No. 6, June 2004).

For obtaining a threshold suited to an NMOSFET, a metallic material having a work function around 4.0 eV is suitable. Though hafnium (Hf), zirconium (Zr) and the like have work functions suitable for NMOSFET, they are high in reactivity and, hence, would cause reduction of the underlying gate insulation film (see, for example, Y. Akasaka et al. "Material Selection for the Metal Gate/High-K Transistors," Ext. Abst. SSDM 2004, p. 196). Besides, in this case, reactivity between the gate insulation film and the gate electrode is so high that the gate insulation film would become thinner, which may increase the leakage current.

The leakage characteristics in the case where hafnium (Hf) is used for the gate electrode and silicon oxide ($SiO_2$) is used for the gate insulation film were evaluated. The results will be described referring to FIG. 9 which is a diagram showing the relationship between gate voltage and leakage current. As shown in FIG. 9, it was found that a rise in gate electrode increases leakage current. This indicates that hafnium (Hf), which is high in reactivity with silicon oxide, breaks the gate insulation film formed of silicon oxide ($SiO_2$), thereby increasing the leakage current.

SUMMARY OF THE INVENTION

Thus, there has been the problem that, while the metallic material having work functions in the vicinity of 4.0 eV are suitable for obtaining a threshold value suited to NMOSFET and such metals include hafnium (Hf), zirconium (Zr) and the like, there metals (Hf, Zr, etc.) are so high in reactivity as to reduce the underlying gate insulation film, and, as a result, the effective thickness of the gate insulation film is reduced, whereby the leakage current is increased.

Accordingly, there is a need to propose a material having a work function suited to MOSFET, and to restrain the increase in leakage current, thereby making it possible to make a gate insulation film thinner.

According to one embodiment of the present invention, there is provided a semiconductor device including a field effect transistor having a gate electrode on the upper side of a semiconductor substrate, with a gate insulation film therebetween. In the semiconductor device, the gate electrode, at least on the gate insulation film side thereof, may include a film containing hafnium and silicon. Preferably, the film containing hafnium and silicon has a composition ratio of silicon based on the total of hafnium and silicon in the range of from 20 to 70%.

In the semiconductor device according to the one embodiment of the present invention, the gate electrode, at least on the gate insulation film side thereof, includes the film containing hafnium and silicon, so that al least the interface between the gate electrode and the gate insulation film is composed of a compound of hafnium and silicon. Therefore, even when a silicon oxide film or a film containing silicon oxide as a main constituent is used as the gate insulation film, hafnium is restrained from undergoing a reduction reaction with the gate insulation film. In addition, the work function of the gate electrode can be brought closer to the work function of the conventional poly-Si gate electrode.

According to another embodiment of the present invention, there is provided a method of manufacturing a semiconductor device, including the step of forming a gate electrode on the upper side of a semiconductor substrate, with a gate insulation film therebetween. In the method of manufacturing a semiconductor device, the step of forming the gate electrode may include the step of forming at least the gate insulation film side of the gate electrode from a film containing hafnium and silicon.

In the method of manufacturing a semiconductor device according to the another embodiment of the present invention, at least the gate insulation film side of the gate electrode is formed from the film containing hafnium and silicon in the step of forming the gate electrode, so that a compound of hafnium and silicon is formed at least at the interface between the gate electrode and the gate insulation film. Therefore, even when a silicon oxide film or a film containing silicon oxide as a main constituent is used as the gate insulation film, hafnium is restrained from undergoing a reduction reaction with the gate insulation film. Besides, the gate electrode can be so formed as to have a work function close to the work function of the conventional poly-Si gate electrode.

In the semiconductor device according to the one embodiment of the present invention, a compound of hafnium and silicon is formed at least at the interface between the gate electrode and the gate insulation film, so that the reactivity of the gate electrode with the underlying gate insulation film can be lowered. Therefore, it is possible to restrain the gate leakage and to realize a thinner gate insulation film. In addition, since the work function of the gate electrode can be set close to the work function of the conventional poly-Si gate electrode, a Vth value suited to MOSFET can be obtained, which promises a higher MOSFET performance.

In the method of manufacturing a semiconductor device according to the another embodiment of the present invention, a compound of hafnium and silicon is formed at least at the interface between the gate electrode and the gate insulation film, so that the reactivity of the gate electrode with the underlying gate insulation film can be lowered. Therefore, it is possible to restrain the gate leakage, and to realize a thinner gate insulation film. Besides, since the gate electrode can be so formed as to have a work function close to the work function of the conventional poly-Si gate electrode, a MOSFET having a Vth value suited to MOSFET can be manufactured.

DETAILED DESCRIPTION OF THE PREFERRED EMBODIMENTS

The semiconductor device according to the present invention is, for example, an NMOSFET having a gate electrode on a gate insulation film, wherein at least the gate insulation film side of the gate electrode is composed of a film containing silicon (Si) and hafnium (Hf), and the composition ratio Si/(Hf+Si) of silicon based on the total of hafnium and silicon is in the range of from 20 to 70%.

Figure 1:
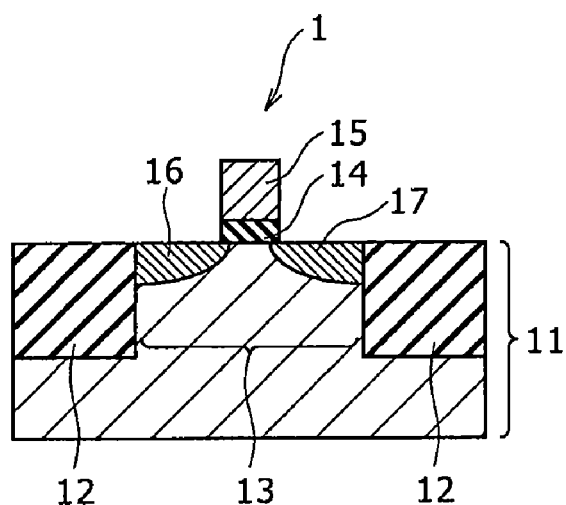
FIG. 1 is a schematic configuration sectional diagram showing a first example of an embodiment of the semiconductor device according to the present invention.

Now, a first example of an embodiment of the semiconductor device according to the present invention will be described below referring to the schematic configuration sectional diagram shown in FIG. 1. In FIG. 1, an NMOSFET will be described, as an example.

As shown in FIG. 1, device isolation regions 12 are formed in a semiconductor substrate 11, whereby a device forming region 13 is partitioned. A silicon substrate, as an example, is used as the semiconductor substrate 11, and the device isolation regions 12 are of an STI (Shallow Trench Isolation) structure, for example. Incidentally, the structure of the device isolation regions 12 is not particularly limited, and there can also be adopted a LOCOS (Local Oxidation of Silicon) structure, an improved LOCOS structure, and the like. A gate electrode 15 is formed on the upper side of the device forming region 13 of the semiconductor substrate 11, with a gate insulation film 14 therebetween. The gate insulation film 14 is composed of a silicon oxide film, for example. The gate electrode 15 is composed of a film containing hafnium and silicon. Therefore, at least the gate insulation film 14 side of the gate electrode 15 is composed of the film containing hafnium and silicon. In addition, source/drain regions 16 and 17 are formed in the semiconductor substrate 11, on both sides of the gate electrode 15.

Figure 2:
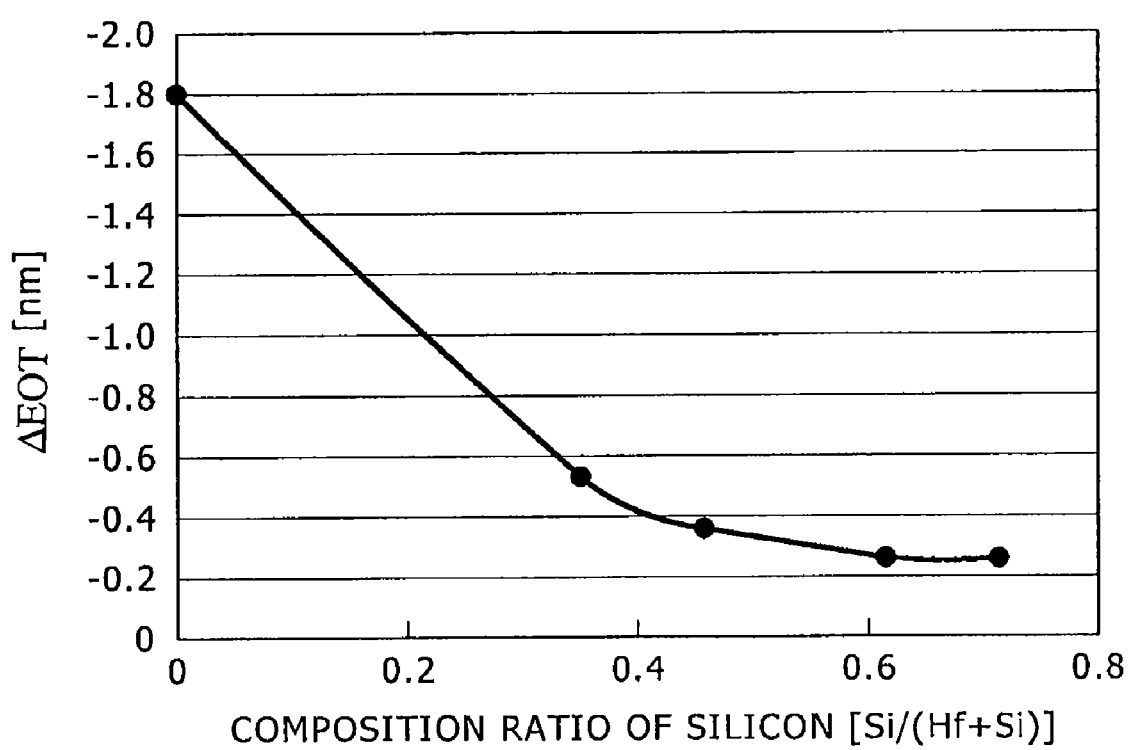
FIG. 2 is a diagram showing the relationship of the difference $\Delta$ EOT between the oxide film basis film thickness of a gate insulation film in the case of using poly-Si for a gate electrode and the oxide film basis film thickness of a gate insulation film in the case of using a film containing hafnium and silicon for a gate electrode, with the composition ratio Si/(Si+Hf) of silicon of the film containing hafnium and silicon.

In the next place, the film containing hafnium and silicon (HfSi$_x$ film) will be described. First, it will be described referring to FIG. 2 that, by adding silicon to hafnium, reaction of the gate electrode with the underlying gate insulation film composed of silicon oxide is restrained, whereby a reduction in the effective thickness of the gate insulation film can be suppressed. In FIG. 2, the difference between the oxide film basis film thickness of the gate insulation film in the case of using poly-Si for the gate electrode and the oxide film basis film thickness of the gate insulation film in the case of using a film containing hafnium and silicon (HfSi$_x$ film) for the gate electrode is taken on the axis of ordinates as $\Delta$ EOT (EOT is an abbreviation of Effective Oxide Thickness), and the composition ratio of silicon [Si/(Hf+Si)] in the film containing hafnium and silicon is taken on the axis of abscissas. Incidentally, in the figure, when the composition ratio Si/(Hf+Si) is 0, the value for a gate electrode consisting only of hafnium is indicated.

From FIG. 2 it is seen that $\Delta$ EOT decreases with an increase in the composition ratio of silicon [Si/(Hf+Si)]. For example, in the 0.1 µm generation NMOSFET needing a gate insulation film thickness of about 2 nm, it may be necessary for restraining the reduction in the thickness of the gate insulation film to control the $\Delta$ EOT to or below about 1 nm at maximum, or to or below 1.1 nm taking scattering into account. Therefore, it may be necessary for the composition ratio of silicon to be not less than 0.2 (20%). In addition, a smaller $\Delta$ EOT value is more favorable; in the case of the 0.1 µm generation NMOSFET needing a gate insulation film thickness of about 2 nm, the ΔEOT is preferably not more than about ⅓ times the thickness of the gate insulation film, for example, not more than 0.7 nm. For obtaining such a ΔEOT value, it may be necessary for the composition ratio of silicon to be not less than 0.3 (30%). It is seen, therefore, that for restraining the reduction in the thickness of the gate insulation film, it may be necessary for the proportion of silicon (Si) in the $HfSi_x$ film to be at least 20%, preferably not less than 30%.

Figure 3:
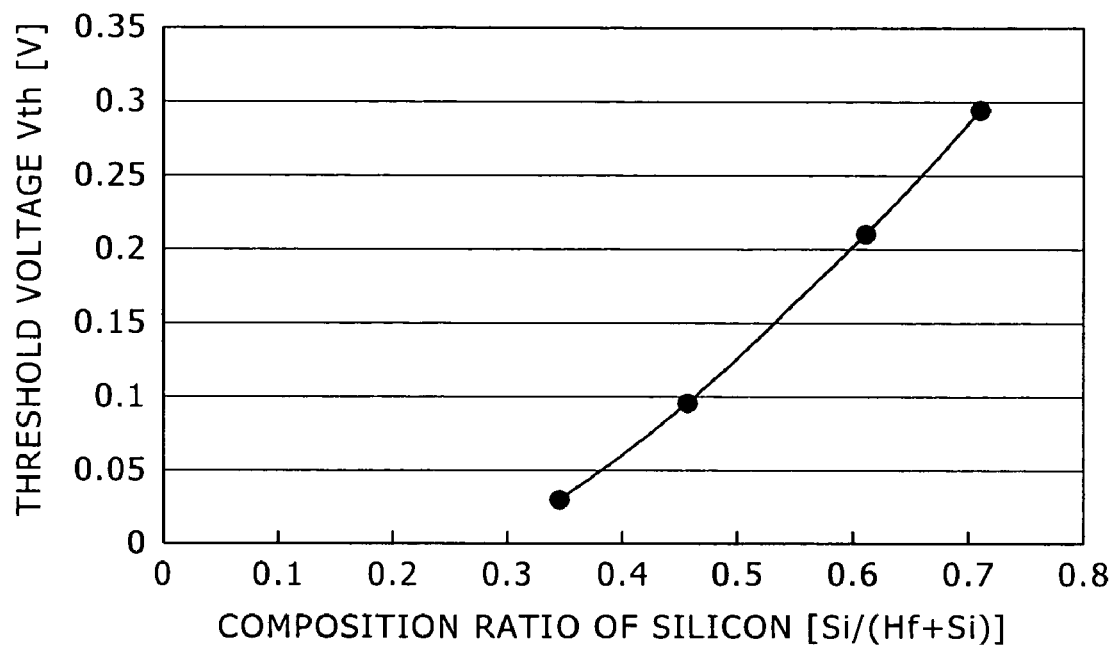
FIG. 3 is a diagram showing the relationship between the threshold Vth of an NMOSFET and the composition ratio Si/(Si+Hf) of a film containing hafnium and silicon.

In the next place, it will be described referring to FIG. 3 that the addition of silicon to hafnium increases the threshold Vth of the NMOSFET. In FIG. 3, the threshold Vth of the NMOSFET is taken on the axis of ordinates, and the composition of silicon [Si/(Hf+Si)] in the film containing hafnium and silicon is taken on the axis of abscissas.

As seen from FIG. 3, an NMOSFET threshold Vth of up to about 0.3 V is applicable. Where the composition ratio of silicon [Si/(Hf+Si)] is low, an applicable NMOSFET threshold Vth can be obtained, but Vth increases with an increase in the proportion of Si in the film; thus, an Si composition ratio of about 70% is the maximum value applicable to NMOSFET.

As has been described above referring to FIGS. 2 and 3, it may be necessary that the composition ratio of silicon [Si/(Hf+Si)] in the film containing hafnium and silicon ($HfSi_x$ film) to be used as the gate electrode 15 is in the range of from 20 to 70%, preferably, from 30 to 70%.

Besides, the semiconductor device 1 as above is applicable not only to semiconductor devices having a gate electrode of the planar structure as above but also to semiconductor devices having a gate electrode of the buried type gate structure (for example, Damascene gate structure).

In the semiconductor device 1 as above, the gate electrode 15 is composed of the film containing hafnium and silicon, so that at least the gate insulation film 14 side of the gate electrode 15 is composed of the film containing hafnium and silicon. Therefore, even where a silicon oxide film or a film containing silicon oxide as a main constituent is used as the gate insulation film 14, the reduction of the gate insulation film 14 by hafnium is restrained. In addition, it is possible to set the work function of the gate electrode 15 to a value close to the work function of the conventional poly-Si gate electrode.

Particularly, by controlling the composition ratio of silicon in the film containing hafnium and silicon ($HfSi_x$ film) used for the gate electrode 15 to within the range of from 20 to 70%, a Vth suited to NMOSFET can be obtained, and the property toward the reduction of the underlying gate insulation film 14 can be suppressed.

Now, a second example of the embodiment of the semiconductor device according to the present invention will be described below referring to the schematic configuration sectional diagram shown in FIG. 4.

Figure 4:
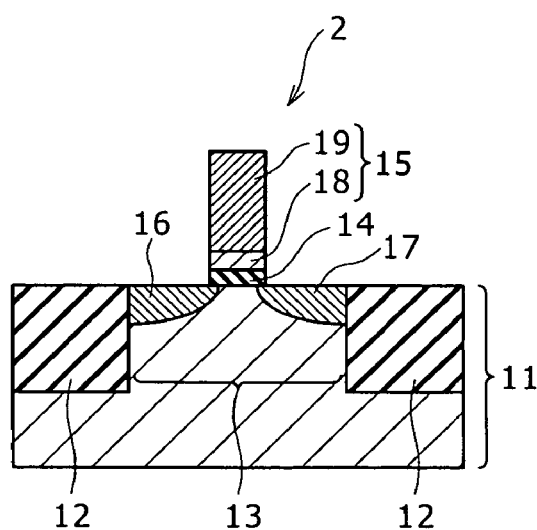
FIG. 4 is a schematic configuration sectional diagram showing a second example of the embodiment of the semiconductor device according to the present invention.

As shown in FIG. 4, device isolation regions 12 are formed in a semiconductor substrate 11, whereby a device forming region 13 is partitioned. A silicon substrate, as an example, is used as the semiconductor substrate 11, and the device isolation regions 12 are of an STI (Shallow Trench Isolation) structure, for example. The structure of the device isolation regions 12 is not particularly limited, and there can also be adopted a LOCOS (Local Oxidation of Silicon) structure, an improved LOCOS structure and the like. A gate electrode 15 is formed on the upper side of the device forming region 13 of the semiconductor substrate 11, with a gate insulation film 14 therebetween. The gate insulation film 14 is composed, for example, of a silicon oxide film. The gate electrode 15, at least on the gate insulation film 14 side thereof, is composed of a film 18 containing hafnium and silicon. The film 18 containing hafnium and silicon will be described in detail later.

An upper electrode film 19 is formed on the film 18 containing hafnium and silicon. The upper electrode film 19 is composed, for example, of a polycrystalline silicon film, at least one metallic film or metallic compound film, a laminate film of a polycrystalline silicon film and a metallic film, or a laminate film of a polycrystalline silicon film and a metallic compound film. Examples of the metallic film usable include a tungsten film and a tantalum film. Examples of the metallic compound film usable include a tantalum nitride film, a titanium nitride film, a tungsten nitride film and a hafnium nitride film.

In the next place, the film containing hafnium and silicon (HfSix film) will be described. First, the fact that it is possible by addition of silicon to hafnium to restrain the gate electrode from reacting with the underlying gate insulation film formed of silicon oxide and to suppress the reduction in the effective thickness of the gate insulation film is the same as above-described referring to FIG. 2. Therefore, it is seen that for suppressing the reduction in the thickness of the gate insulation film, it may be necessary for the proportion of silicon (Si) in the $HfSi_x$ film to be at least 20%, preferably not less than 30%.

Next, the fact that the addition of silicon to hafnium increases the threshold Vth of the NMOSFET is the same as above-described referring to FIG. 3. Therefore, in the case where the composition ratio of silicon [Si/(Hf+Si)] is low, a Vth applicable to NMOSFET can be obtained. On the other hand, Vth increases with an increase in the proportion of Si in the film, and, if the threshold Vth of the NMOSFET can have a value of up to about 0.3 V, an Si composition ratio of about 70% becomes the maximum value applicable to NMOSFET.

As described above referring to FIGS. 2 and 3, it may be necessary that the composition ratio of silicon [Si/(Hf+Si)] in the film containing hafnium and silicon ($HfSi_x$ film) used as the gate electrode 15 is in the range of from 20 to 70%, preferably from 30 to 70%.

While the gate electrode has been described to be of the planar structure in the semiconductor device 2 above, the gate electrode is applicable also to the buried type gate structure (for example, Damascene gate structure).

In the semiconductor device 2 as above, at least the gate insulation film 14 side of the gate electrode 15 is composed of the film 18 containing hafnium and silicon, so that at least the interface between the gate electrode 15 and the gate insulation film 14 is composed of a compound of hafnium and silicon. Therefore, even when a silicon oxide film or a film containing silicon oxide as a main constituent is used as the gate insulation film 14, the reduction of the gate insulation film 14 by hafnium is restrained. In addition, the work function of the gate electrode 15 on the gate insulation film 14 side can be set close to the work function of the conventional poly-Si gate electrode. Besides, the configuration in which the gate electrode 15 has a laminate structure of the film 18 containing hafnium and silicon with the upper electrode film 19 makes it possible to make thinner the film 18 containing hafnium and silicon. This makes it possible to reduce the amount of hafnium which may react with the underlying gate insulation film 14, so that the gate insulation film 14 can be restrained from being reduced in thickness due to the use of the film 18 containing hafnium and silicon for the gate electrode 15.

Now, a first example of an embodiment of the method of manufacturing a semiconductor device according to the present invention will be described below referring the manufacturing step sectional diagrams shown in FIGS. 5A to 5C.

This manufacturing method is a method of manufacturing the semiconductor device 1 described referring to FIG. 1 above.

Figure 5A:
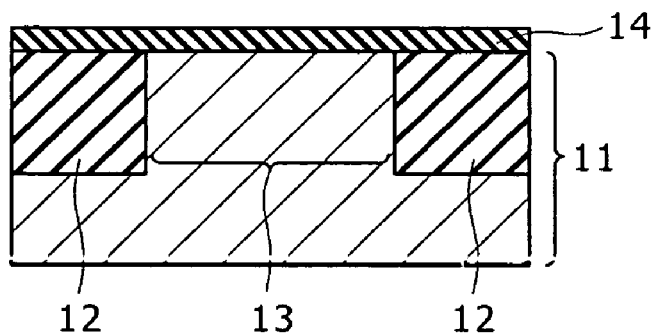
FIGS. 5A to 5C are manufacturing step sectional diagrams showing a first example of an embodiment of the method of manufacturing a semiconductor device according to the present invention.

As shown in FIG. 5A, device isolation regions 12 are formed in a semiconductor substrate 11, to partition a device forming region 13. A silicon substrate, as an example, is used as the semiconductor substrate 11, and the device isolation regions 12 are of an STI (Shallow Trench Isolation) structure, for example. Incidentally, the structure of the device isolation regions 12 is not particularly limited, and there can also be adopted a LOCOS (Local Oxidation of Silicon) structure, an improved LOCOS structure and the like. A gate insulation film 14 is formed on the semiconductor substrate 11. The gate insulation film 14 is composed, for example, of a silicon oxide film.

Figure 5B:
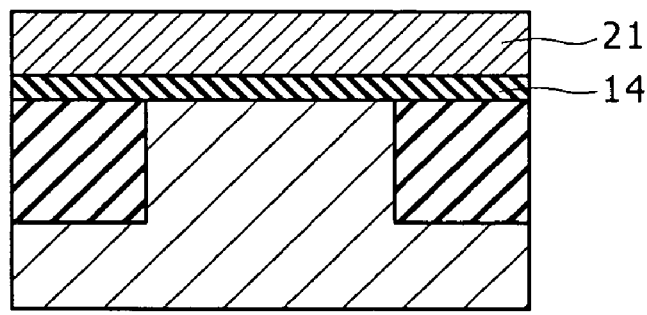

Next, as shown in FIG. 5B, a gate electrode forming film 21 is formed on the gate insulation film 14. The gate electrode forming film 21 is composed, for example, of a film containing hafnium and silicon ($HfSi_x$ film), and can be formed, for example, by sputtering. The $HfSi_x$ film is formed under such a condition that the composition ratio of silicon to the total of hafnium and silicon [Si/(Hf+Si)] would be in the range of from 20 to 70%. The setting of the composition ratio of silicon to within the range of from 20 to 70% is the same as above-described referring to FIGS. 2 and 3.

An example of the conditions for forming the film containing hafnium and silicon ($HfSi_x$ film) will be described below. Hafnium and silicon are used as targets of sputtering. The pressure of the process atmosphere is set to within the range of from 13.3 mPa to 13.3 Pa, and Ar is used as the process gas. The substrate temperature is set to within the range of from room temperature to 150° C. The sputtering conditions for forming the $HfSi_x$ film may not necessarily be limited as just-mentioned. For example, $HfSi_x$ with an Si composition ratio in the range of from 20 to 70% may be used as the target. Besides, the film forming method is may not necessarily be limited to sputtering; for example, CVD may be adopted for forming the film.

Figure 5C:
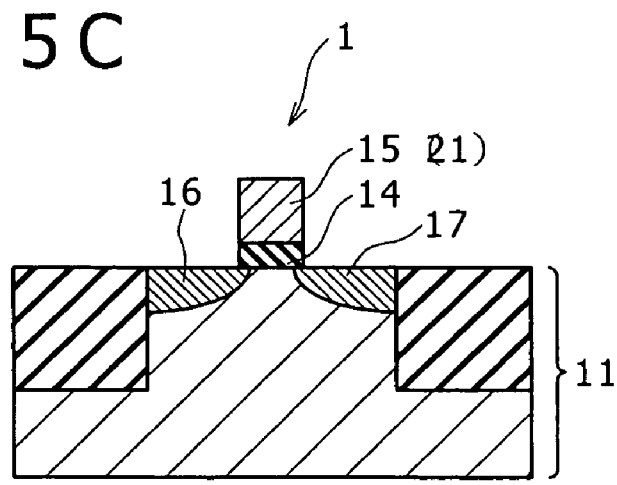

Thereafter, as shown in FIG. 5C, for example by ordinary resist application, photolithography technique and etching technique, the gate electrode forming film 21 is etched to form a gate electrode 15 composed of the gate electrode forming film 21 on the gate insulation film 14. Further, by an ordinary technology of forming source/drain regions of MOS transistor, source/drain regions 16 and 17 are formed in the semiconductor substrate 11 on both sides of the gate electrode 15. The source/drain regions 16 and 17 may be, for example, of an LDD (Lightly Doped Drain) structure, though not shown in the figure. In this manner, the semiconductor device 1 can be obtained.

In addition, the method of manufacturing the semiconductor device 1 as above-described is applicable not only to semiconductor devices having a gate electrode of the planar structure as above but also to semiconductor devices having a gate electrode of a buried type gate structure (for example, Damascene gate structure).

In the method of manufacturing the semiconductor device 1 as above, the gate electrode 15 is composed of the film containing hafnium and silicon ($HfSi_x$ film), so that at least the gate insulation film 14 side of the gate electrode 15 is composed of the film containing hafnium and silicon. Therefore, even when the gate insulation film 14 is composed of a silicon oxide film or a film containing silicon oxide as a main constituent, the reduction of the gate insulation film 14 by hafnium is restrained. In addition, the work function of the gate electrode 15 can be set to a value close to the work function of the conventional poly-Si gate electrode.

Particularly, by setting the composition ratio of silicon [Si/(Hf+Si)] in the film containing hafnium and silicon ($HfSi_x$ film) used for the gate electrode 15 to within the range of from 20 to 70%, a Vth suited to NMOSFET can be obtained, and the reduction of the underlying gate insulation film 14 can be restrained.

Now, a second example of the embodiment of the method of manufacturing a semiconductor device according to the present invention will be described referring to manufacturing step sectional diagrams shown in FIGS. 6A to 6D. This manufacturing method is a method for manufacturing the semiconductor device 2 described referring to FIG. 4 above.

Figure 6A:
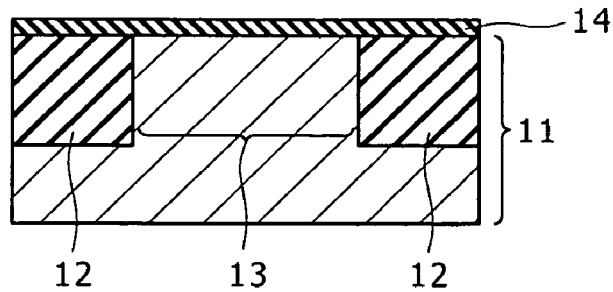
FIGS. 6A to 6D are manufacturing step sectional diagrams showing a second example of the embodiment of the method of manufacturing a semiconductor device according to the present invention.

As shown in FIG. 6A, device isolation regions 12 are formed in a semiconductor substrate 11, to partition a device forming region 13. A silicon substrate, as an example, is used as the semiconductor substrate 11, and the device isolation regions 12 are of an STI (Shallow Trench Isolation) structure, for example. The structure of the device isolation regions 12 is not particularly limited, and there can also be adopted a LOCOS (Local Oxidation of Silicon) structure, an improved LOCOS structure and the like. A gate insulation film 14 is formed on the semiconductor substrate 11. The gate insulation film 14 is composed of a silicon oxide film, for example.

Figure 6B:
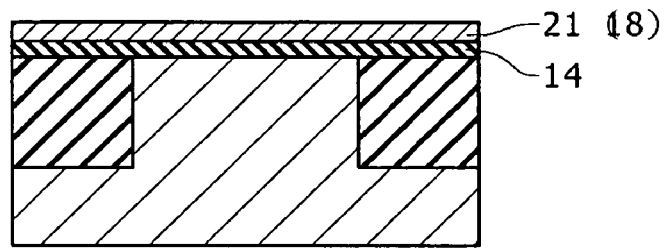

Next, as shown in FIG. 6B, a lower layer portion of a gate electrode forming film 21 is formed on the gate insulation film 14 from, for example, a film containing hafnium and silicon ($HfSi_x$ film) 18. The film containing hafnium and silicon ($HfSi_x$ film) 18 can be formed, for example, by sputtering. The $HfSi_x$ film is formed under such conditions that the composition ratio of silicon to the total of hafnium and silicon [Si/(Hf+Si)] will be in the range of from 20 to 70%. The setting of the composition ratio of silicon to within the range of from 20 to 70% is the same as above-described referring to FIGS. 2 and 3.

An example of the conditions for forming the film containing hafnium and silicon ($HfSi_x$ film) 18 will be described below. Hafnium and silicon are used as targets of sputtering. The pressure of the process atmosphere is set within the range of from 13.3 mPa to 13.3 Pa, and Ar is used as the process gas. The substrate temperature is set to within the range of from room temperature to 150° C. Incidentally, the sputtering conditions for forming the $HfSi_x$ film may not necessarily be limited as just-mentioned; for example, $HfSi_x$ having a composition ratio of silicon within the range of from 20 to 70% may be used as the target. Besides, the film forming method may not necessarily be limited to sputtering; for example, CVD may be used for forming the film.

Figure 6C:
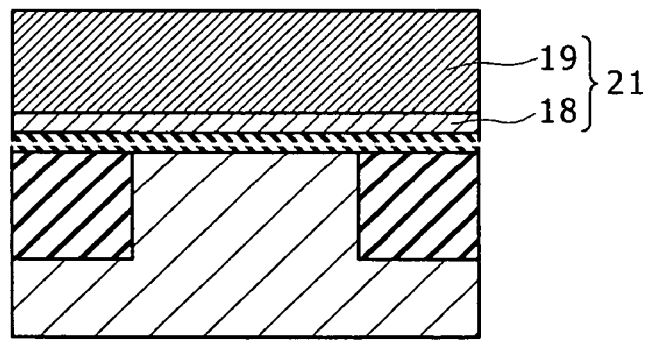

Next, as shown in FIG. 6C, an upper electrode film 19 is formed on the film containing hafnium and silicon ($HfSi_x$ film) 18, to obtain a gate electrode forming film 21. The upper electrode film 19 can be composed, for example, of a polycrystalline silicon film, at least one metallic film or metallic compound film, a laminate film of a polycrystalline silicon film and a metallic film, or a laminate film of a polycrystalline silicon film and a metallic compound film. Examples of the metallic film usable include a tungsten film and a tantalum film. Examples of the metallic compound film usable include a tantalum nitride film, a titanium nitride film, a tungsten nitride film, and a hafnium nitride film.

An example of the conditions for forming the upper electrode film 19 will be described. The film is formed by CVD, for example. An example of the film forming conditions includes titanium tetrachloride ($TiCl_4$) and ammonia ($NH_3$) as the process gas, a process atmosphere pressure in the range of from 13.3 Pa to 1.33 kPa, and a substrate temperature in the range of from 400 to 700° C. Incidentally, the method of forming the upper electrode film 19 may not necessarily be limited as just-mentioned, and the film may be formed by sputtering.

Figure 6D:
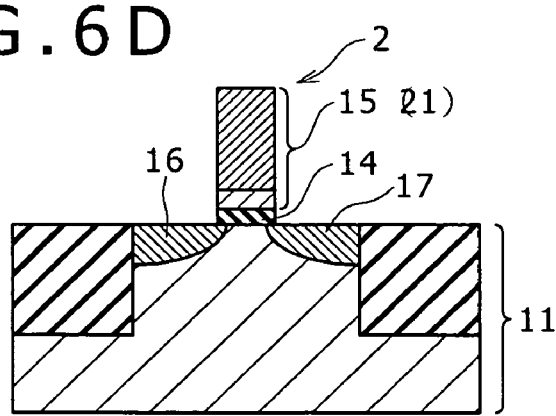

Thereafter, as shown in FIG. 6D, for example by ordinary resist application, photolithography technique and etching technique, the gate electrode forming film 21 is etched, to form a gate electrode 15 composed of the gate electrode forming film 21 on the gate insulation film 14. Further, by an ordinary technology of forming source/drain regions of MOS transistor, source/drain regions 16 and 17 are formed in the semiconductor substrate 11 on both sides of the gate electrode 15. The source/drain regions 16 and 17 may be, for example, of an LDD (Lightly Doped Drain) structure, though not shown in the figure. In this manner, the semiconductor device 2 can be obtained.

In addition, the method of manufacturing the semiconductor device 2 as above is applicable not only to semiconductor devices having a gate electrode of the planar structure as above-described but also to semiconductor devices having a gate electrode of a buried type gate structure (for example, Damascene gate structure).

In the method of manufacturing the semiconductor device 2 as above, at least the gate insulation film 14 side of the gate electrode 15 is composed of the film 18 containing hafnium and silicon, so that even when the gate insulation film 14 is composed of a silicon oxide film or a film containing silicon oxide as a main constituent, the reduction of the gate insulation film 14 by hafnium is restrained. Besides, the work function of the gate electrode 15 on the gate insulation film 14 side can be set close to the work function of the conventional poly-Si gate electrode.

Particularly, by setting the composition ratio of silicon [Si/(Hf+Si)] in the film containing hafnium and silicon (HfSi$_x$ film) 18 used for the gate electrode 15 to within the range of from 20 to 70%, a Vth suited to NMOSFET can be obtained, and the property toward reduction of the underlying gate insulation film 14 can be restrained.

Furthermore, in the method of manufacturing the semiconductor device 2 as above, the gate electrode 15 has a laminate structure of the film 18 containing hafnium and silicon with the upper electrode film 19, so that the film containing hafnium and silicon (HfSi$_x$ film) 18 can be formed to be thinner. Therefore, it is possible to reduce the thickness of the film 18 containing hafnium and silicon. This makes it possible to reduce the amount of hafnium which will react with the underlying gate insulation film 14, so that the reduction in the thickness of the gate insulation film 14 due to the use of the film 18 containing hafnium and silicon for the gate electrode 15 can be further restrained.

Figure 7:
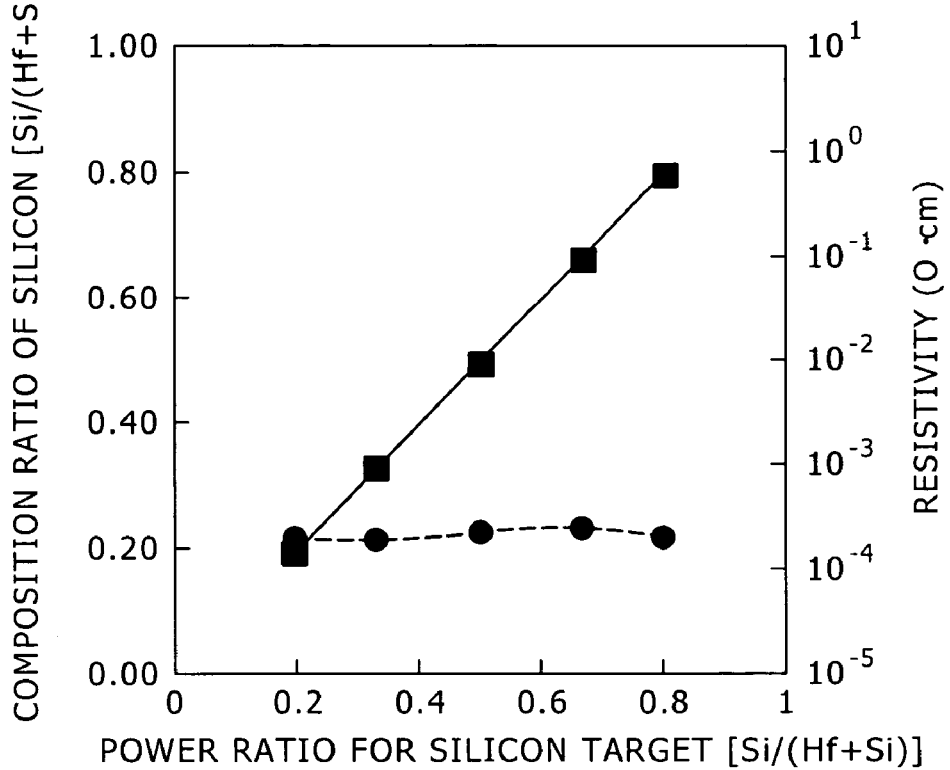
FIG. 7 is a diagram showing the relationship of the composition ratio of silicon of a HfSi$_x$ film, with the ratio of the power impressed on a silicon target in sputtering the HfSi$_x$ film to the sum of the powers impresses respectively on the silicon target and a hafnium target.

In the methods of manufacturing a semiconductor device as above, the silicon composition ratio [Si/(Hf+Si)] in the HfSi$_x$ film formed by sputtering depends on the ratio between the powers impressed respectively on the hafnium target and the silicon target by the sputtering apparatus. This will be described referring to FIG. 7. In FIG. 7, the composition ratio of silicon [Si/(Hf+Si)] in the HfSi$_x$ film is taken on the left axis of ordinates, and the ratio of the power impressed on the silicon target to the sum of the powers impressed on the silicon target and the hafnium target [Si/(Hf+Si) power ratio] in forming the HfSi$_x$ film is taken on the axis of abscissas. In addition, resistivity ($\Omega$·cm) in relation to the composition ratio of silicon in the HfSi$_x$ film is taken on the right axis of ordinates.

It is seen from FIG. 7 that the composition ratio of silicon [Si/(Hf+Si)] in the HfSi$_x$ film is directly proportional to the ratio of the power impressed on the silicon target to the sum of the powers impressed on the silicon target and the hafnium target [Si/(Hf+Si)] in the sputtering apparatus. Therefore, the composition ratio of silicon can be controlled by the sputtering powers. Incidentally, the resistivity was substantially constant, independent of the composition ratio of silicon in the HfSi$_x$ film.

Figure 8:
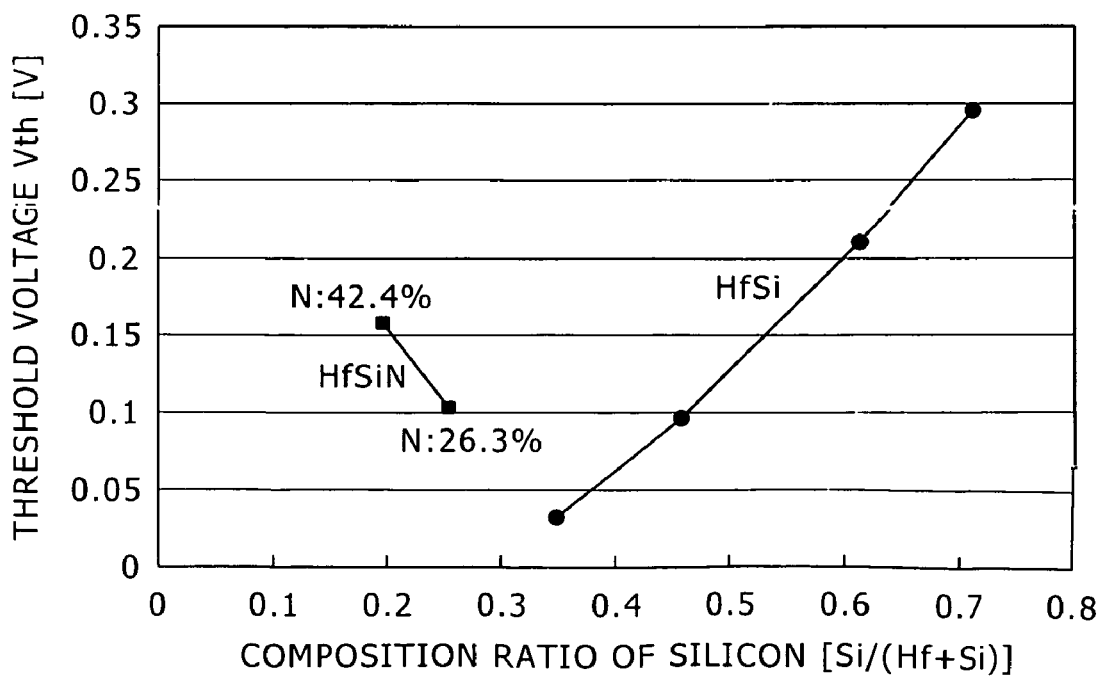
FIG. 8 is a diagram showing the relationship between the threshold Vth of an NMOSFET and the composition ratio Si/(Si+Hf) of silicon of a film containing hafnium and silicon, with the composition ratio of nitrogen as a parameter.
Figure 9:
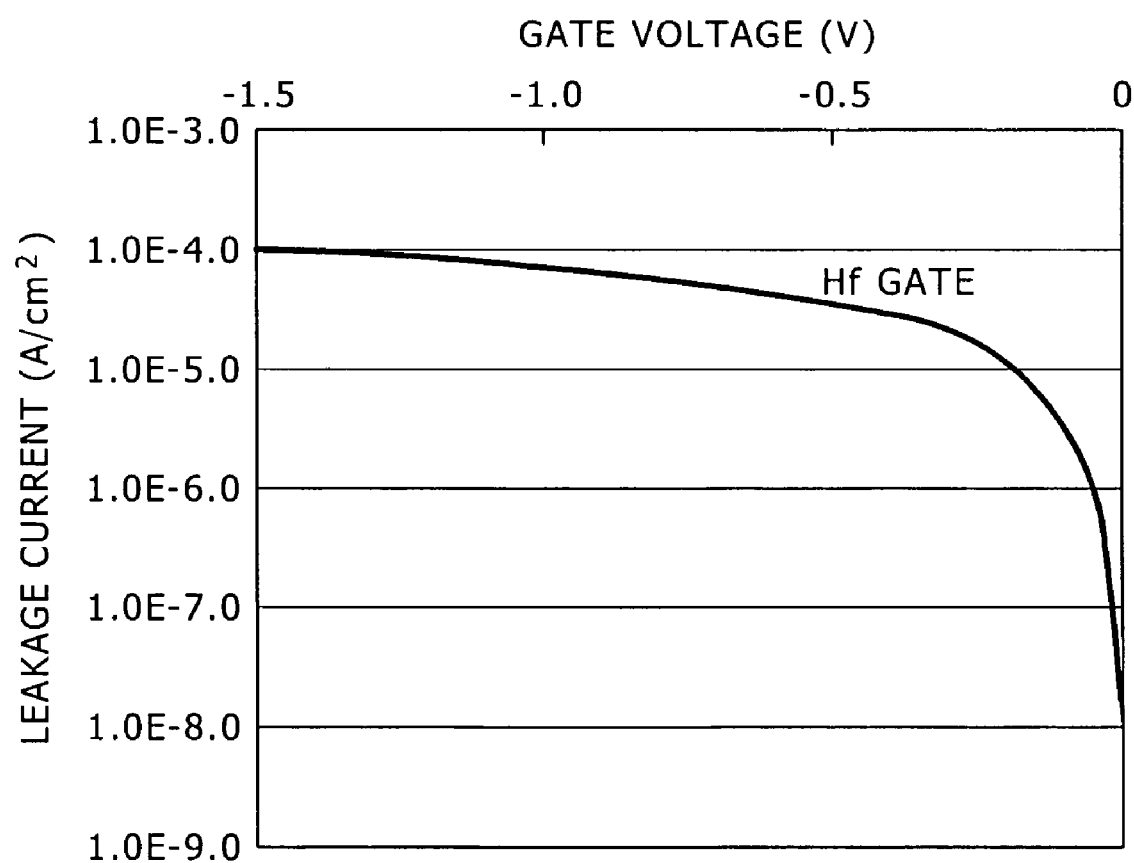
FIG. 9 is a diagram showing the relationship between gate voltage and leakage current, in an NMOSFET using a conventional hafnium gate electrode.

It has been found that, in the semiconductor devices and the methods of manufacturing a semiconductor device as above-described, also when a hafnium silicide nitride (HfSiN) film is used as the film containing hafnium and silicon, a Vth similar to that in the case of the HfSi$_x$ film is obtained. This will be described referring to FIG. 8. FIG. 8 is a diagram in which data of threshold voltage of HfSiN film is added to a diagram showing the relationship of the threshold Vth of the NMOSFET with the composition ratio of silicon Si/(Si+Hf) in the film containing hafnium and silicon shown in FIG. 3.

For example, as shown in FIG. 8, when the composition ratio of silicon in the HfSiN film was 20%, the composition ratio of nitrogen (N) was 42.4%, and the threshold voltage was 0.157 V. Besides, when the composition ratio of silicon was 26%, the composition ratio of nitrogen (N) was 26.3%, and the threshold voltage was 0.104 V. Thus, even in the case of the film containing hafnium and silicon and nitrogen, i.e., the hafnium silicide nitride (HfSiN) film, a Vth similar to that in the case of the HfSi$_x$ film was obtained.

Therefore, when a film containing at least hafnium and silicon is configured to have the composition ratio of silicon [Si/(Hf+Si)] is in the range of from 20 to 70%, the film may contain other elements than hafnium. Besides, as has been described above, heat resistance is enhanced when nitrogen is additionally contained in the film containing hafnium and silicon, so that the heat resistance of the gate electrode 15 formed by use of this film is also enhanced.

Examples of the element which can be contained in the film containing hafnium and silicon include not only nitrogen but also carbon (C), tantalum (Ta), titanium (Ti), tungsten (W), zirconium (Zr), and molybdenum (Mo). Among these elements, tantalum (Ta) and zirconium (Zr) have work functions comparable to the work function of hafnium (about 4.0 eV). Besides, titanium (Ti), tungsten (W) and molybdenum (Mo) have work functions greater than the work function of hafnium, and the work functions are in the vicinity of the mid gap (about 4.6 eV). When any of these metals is added to the film containing hafnium and silicon, the work function of the film is shifted toward the work function(s) of the added metal(s), addition of these metals can be used to control the work function of the gate electrode.

According to the semiconductor device and the method of manufacturing a semiconductor device of the present invention, a Vth suited to NMOSFET can be obtained. In addition, it becomes possible to suppress the reactivity between the gate electrode, formed by the film containing hafnium and silicon, and the underlying gate insulation film, so that it becomes possible to restrain the gate leakage and to realize a thinner gate insulation film. Besides, the reduction of the thickness of the film containing hafnium and silicon makes it possible to reduce the amount of reaction of hafnium in the film containing hafnium and silicon with the underlying gate insulation film, whereby the reduction in the thickness of the gate insulation film can be further restrained.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising a field effect transistor having a gate electrode on an upper side of a semiconductor substrate, with a gate insulation film therebetween, wherein
    said gate electrode, at least on the gate insulation film side thereof, includes a film containing hafnium and silicon and a metallic film formed on said film,
    wherein said gate electrode is of a damascene gate structure.

2. The semiconductor device as set forth in claim 1, wherein said film containing hafnium and silicon has a composition ratio of silicon based on the total of hafnium and silicon of from 20 to 70%.

3. The semiconductor device as set forth in claim 1, wherein said metallic film contains hafnium and silicon and has a conductive film formed on said metallic film.

4. The semiconductor device as set forth in claim 1, wherein said film containing hafnium and silicon includes a metallic compound containing hafnium, silicon, and nitrogen.

5. A method of manufacturing a semiconductor device, the method comprising:
    forming a gate electrode having a first portion and a second portion, each of different material, on an upper side of a semiconductor substrate, with a gate insulation film between the first portion of said gate electrode and said semiconductor substrate,
    wherein said step of forming said gate electrode includes the step of forming, at least on the gate insulation film side of said gate electrode, a film containing hafnium and silicon as said first portion and a conductive film formed on said film containing hafnium and silicon as said second portion,
    wherein said gate electrode is of a damascene gate structure.

6. The method of manufacturing a semiconductor device according to claim 5 wherein said step of forming said gate electrode includes the step of forming said first portion of said gate electrode with a thickness approximately equal to a thickness of the gate insulation film.

7. The method of manufacturing a semiconductor device according to claim 5 wherein said step of forming said gate electrode includes the step of sequentially layering the gate insulation film, the first portion of said gate electrode, and the second portion of said gate electrode.

8. A semiconductor device having a field effect transistor, the semiconductor device comprising:
    a gate electrode on an upper side of a semiconductor substrate;
    a gate insulation film between the gate electrode and the semiconductor substrate;
    a lower gate electrode film containing hafnium and silicon on a lower portion of said gate electrode; and
    an upper gate electrode film on an upper portion of said gate electrode containing a material different than the lower gate electrode film,
    wherein said gate electrode is of a damascene gate structure.

9. The semiconductor device as set forth in claim 8, wherein the lower electrode film abuts the gate insulation film.

10. The semiconductor device as set forth in claim 8, wherein the upper electrode film is a polycrystalline silicon film, at least one metallic film or metallic compound film, a laminate film of a polycrystalline silicon film and a metallic film, or a laminate film of a polycrystalline silicon film and a metallic compound film.

11. The semiconductor device as set forth in claim 8, wherein the gate insulation film contains silicon oxide.

12. The semiconductor device as set forth in claim 8, wherein the semiconductor substrate includes the gate insulation film, the lower gate electrode film, and the upper gate electrode film successively layered thereon.

13. The semiconductor device as set forth in claim 8, wherein the gate insulation film has a thickness that is approximately equal to a thickness of the lower gate electrode film.

* * * * *